(12) United States Patent
McNulty et al.

(10) Patent No.: US 9,588,938 B1
(45) Date of Patent: Mar. 7, 2017

(54) SYSTEM-SOLVER CO-WARPING FOR TIME-DOMAIN SOLUTIONS OF CONTINUOUS SYSTEMS

(71) Applicant: The MathWorks, Inc., Natick, MA (US)

(72) Inventors: Tyson C. McNulty, Waltham, MA (US); Joseph J. Wargo, Boston, MA (US)

(73) Assignee: The MathWorks, Inc., Natick, MA (US)

( * ) Notice: Subject to any disclaimer, the term of this patent is extended or adjusted under 35 U.S.C. 154(b) by 966 days.

(21) Appl. No.: 13/835,325

(22) Filed: Mar. 15, 2013

(51) Int. Cl.
  *G06F 17/17* (2006.01)
  *G06F 17/50* (2006.01)

(52) U.S. Cl.
  CPC .......... *G06F 17/17* (2013.01); *G06F 17/5036* (2013.01)

(58) Field of Classification Search
  CPC .............................. G06F 17/17; G06F 17/5036
  See application file for complete search history.

(56) References Cited

U.S. PATENT DOCUMENTS

| | | | | |
|---|---|---|---|---|
| 5,946,482 | A * | 8/1999 | Barford ............... | G06F 17/5036 703/14 |
| 6,135,649 | A * | 10/2000 | Feldmann ........... | G06F 17/5036 703/2 |
| 6,349,272 | B1 * | 2/2002 | Phillips ............... | G06F 17/5036 703/14 |
| 2003/0125914 | A1 * | 7/2003 | Du ...................... | G06F 17/5036 703/2 |

OTHER PUBLICATIONS

Shah, Jatan "An Algorithm for Simulating Power/Ground Networks using Padé Approximants and its Symbolic Implementation" IEEE Transactions on Circuits and Systems II: Analog & Digital Signal Processing, vol. 45, No. 10, pp. 1372-1382 (1998).*
Deturck, Dennis & Wilf, Herbert "Lectures on Numerical Analysis" (2002).*
Thompson, Charles "A Study of Numerical Integration Techniques for Use in the Companion Circuit Method of Transient Circuit Analysis" Thesis, Purdue U. School of Electrical Engineering (1992).*

(Continued)

*Primary Examiner* — Kamini S Shah
*Assistant Examiner* — Jay B Hann
(74) *Attorney, Agent, or Firm* — Harrity & Harrity, LLP

(57) ABSTRACT

A device receives an initial model of a system and information that identifies a solving technique to be used to solve a mathematical problem associated with the initial model. The initial model includes an initial transfer function that describes a relationship between an input to and an output from the system. The device determines an error associated with the solving technique, resulting in an inaccurate solution to the mathematical problem. The device generates an adjusted model, based on the initial model and the error, that includes an adjusted transfer function, based on the initial transfer function, or an adjusted input to the system, based on the input to the system. The device applies the solving technique to the adjusted model, to generate a result that includes a more accurate solution to the mathematical problem than applying the solving technique to the initial model, and outputs or stores the result.

20 Claims, 14 Drawing Sheets

600C

(56) References Cited

OTHER PUBLICATIONS

Angelo Brambilla & Giancarlo Storti-Gajani "Frequency Warping in Time-Domain Circuit Simulation" IEEE Transctions on Circuits & Systems-I: Fundamental Theory & Applications, vol. 50, No. 7, pp. 904-913 (2003).*

Angelo Brambilla, et al. "Recasting Modified Nodal Analysis to Improve Reliability in Numerical Circuit Simulation" IEEE Transactions on Circuits & Systems, vol. 52, No. 3, pp. 522-534 (2005).*

Peter Feldman & Roland W. Freund "Efficient Linear Circuit Analysis by Padé Approximation via the Lanczos Process" IEEE Transactions on Computer-Aided Design of Integrated Circuits & Sys., vol. 14, No. 5, pp. 639-649 (1995).*

* cited by examiner

SYSTEM-SOLVER CO-WARPING FOR TIME-DOMAIN SOLUTIONS OF CONTINUOUS SYSTEMS

DETAILED DESCRIPTION

The following detailed description of example implementations refers to the accompanying drawings. The same reference numbers in different drawings may identify the same or similar elements.

A solver may simulate an output of a system, given an input, by using a mathematical function that calculates the output based on the input. The mathematical function used by the solver typically approximates the output, thereby introducing an error, which may correspond to a difference between the simulated output and an actual output that the system would produce based on the input. Efforts to decrease the error often focus on improving simulation techniques used by the solver, while the input into the solver is left intact. The input to the solver may include a mathematical model of a system, such as a transfer function that describes a manner in which system outputs are calculated from system inputs. Implementations described herein may adjust the model input into the solver to decrease the error introduced by the solver's solving technique.

Figure 1:
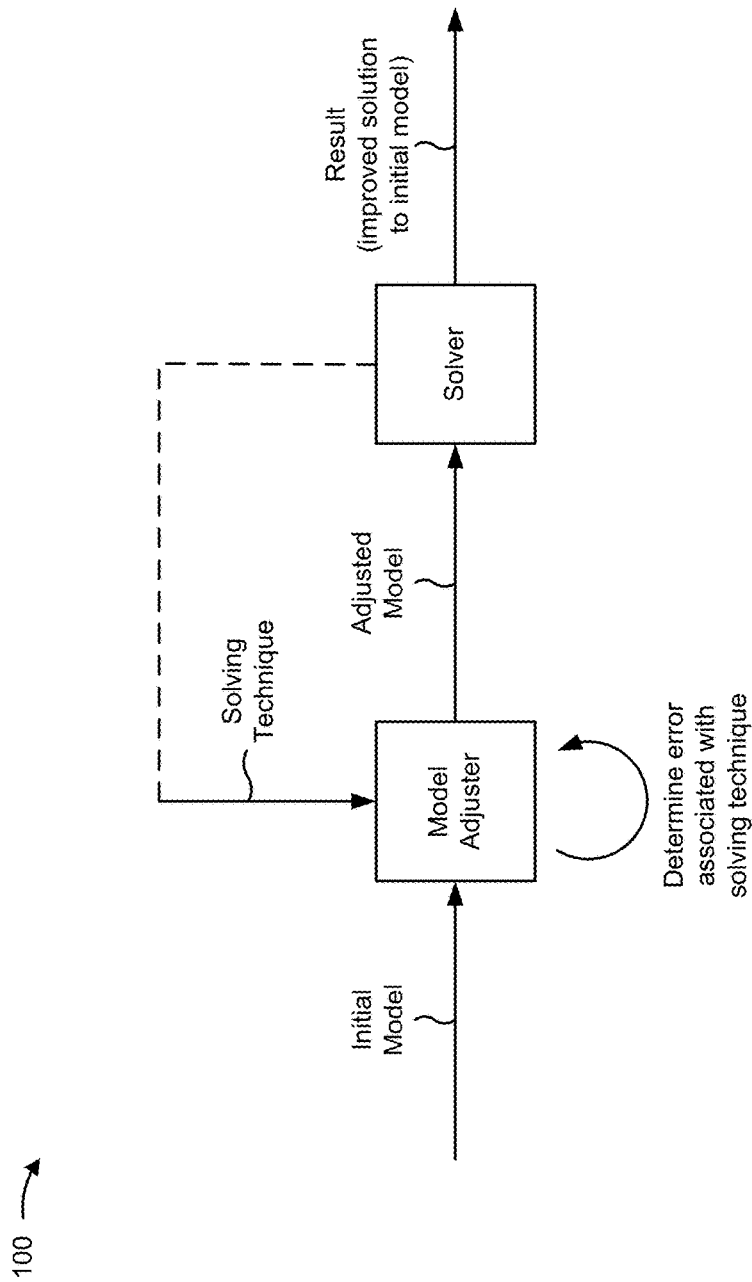
FIG. 1 is a diagram of an overview of an example implementation described herein.

FIG. 1 is a diagram of an overview of an example implementation 100 described herein. As shown in FIG. 1, example implementation 100 may include a model adjuster and a solver.

As further shown in FIG. 1, the model adjuster may receive information that identifies an initial model and a solving technique. The initial model may include a model of a system that a user wants to analyze, such as a circuit, an amplifier, a filter, a mixer, an oscillator, or the like. In some implementations, the initial model may include a mathematical function that calculates outputs from the system based on inputs to the system. The solving technique may identify a technique that is to be applied to the initial model to generate a solution associated with an analysis of the system. In some implementations, the model adjuster may determine the solving technique based on information that identifies the solver.

As further shown in FIG. 1, the model adjuster may determine an error associated with the solving technique. For example, the solving technique may produce a solution with a known error when applied to particular models and/or when applied to particular solution spaces. The model adjuster may generate an adjusted model based on the initial model and the error. The model adjuster may use the error to generate the adjusted model in a manner that compensates for the error. For example, when the solver applies the solving technique to the adjusted model, the solver may generate a result that represents an improved (e.g., more accurate) solution to the initial model than if the solver were to apply the solving technique directly to the initial model. The more accurate solution to the initial model may be equivalent to the inaccurate solution to the adjusted model.

Figure 2:
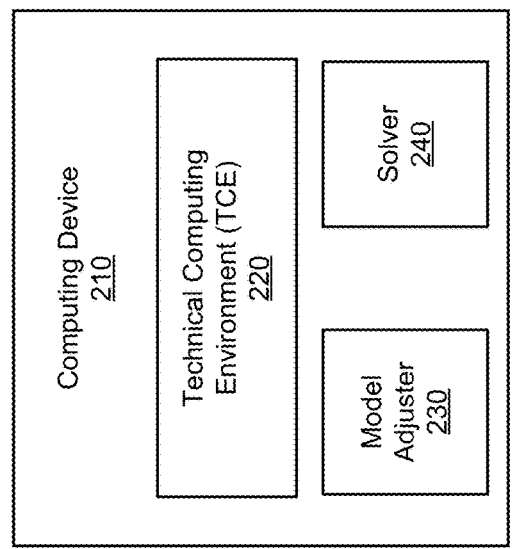
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include a computing device 210, which may include a technical computing environment (TCE) 220, a model adjuster 230, and a solver 240.

Computing device 210 may include a device capable of modeling and/or solving problems. For example, computing device 210 may include a computer (e.g., a desktop computer, a laptop computer, a tablet computer, a handheld computer, a server, etc.), a mobile phone (e.g., a smart phone, a radiotelephone, etc.), or a similar device.

Computing device 210 may host TCE 220. TCE 220 may include hardware-based logic or a combination of hardware-based and software-based logic that provides a computing environment that allows tasks to be performed (e.g., by users) related to disciplines, such as, but not limited to, mathematics, science, engineering, medicine, and business. TCE 220 may include a text-based environment (e.g., MATLAB® software), a graphically-based environment (e.g., Simulink® software, Stateflow® software, SimEvents® software, etc., by The MathWorks, Inc.; VisSim by Visual Solutions; LabView® by National Instruments; etc.), or another type of environment, such as a hybrid environment that may include, for example, a text-based environment and a graphically-based environment.

Computing device 210 may host model adjuster 230. Model adjuster 230 may include hardware-based logic or a combination of hardware-based and software-based logic that provides a computing environment that allows models to be created, received, and/or adjusted. Computing device 210 may also host solver 240. Solver 240 may include hardware-based logic or a combination of hardware-based and software-based logic that provides a computing environment that allows models to be solved. For example, solver 240 may solve a model by applying a solving technique, such as an algorithm, to the model. In some implementations, model adjuster 230 and/or solver 240 may be integrated into TCE 220.

The number of devices shown in FIG. 2 is provided as an example. In practice, there may be additional devices or different devices than those shown in FIG. 2. Furthermore, computing device 210 may be implemented as multiple, distributed devices. Additionally, the functions described as being performed by computing device 210 may be performed by another device or a group of devices, such as a server device in communication with computing device 210 via a network.

Figure 3:
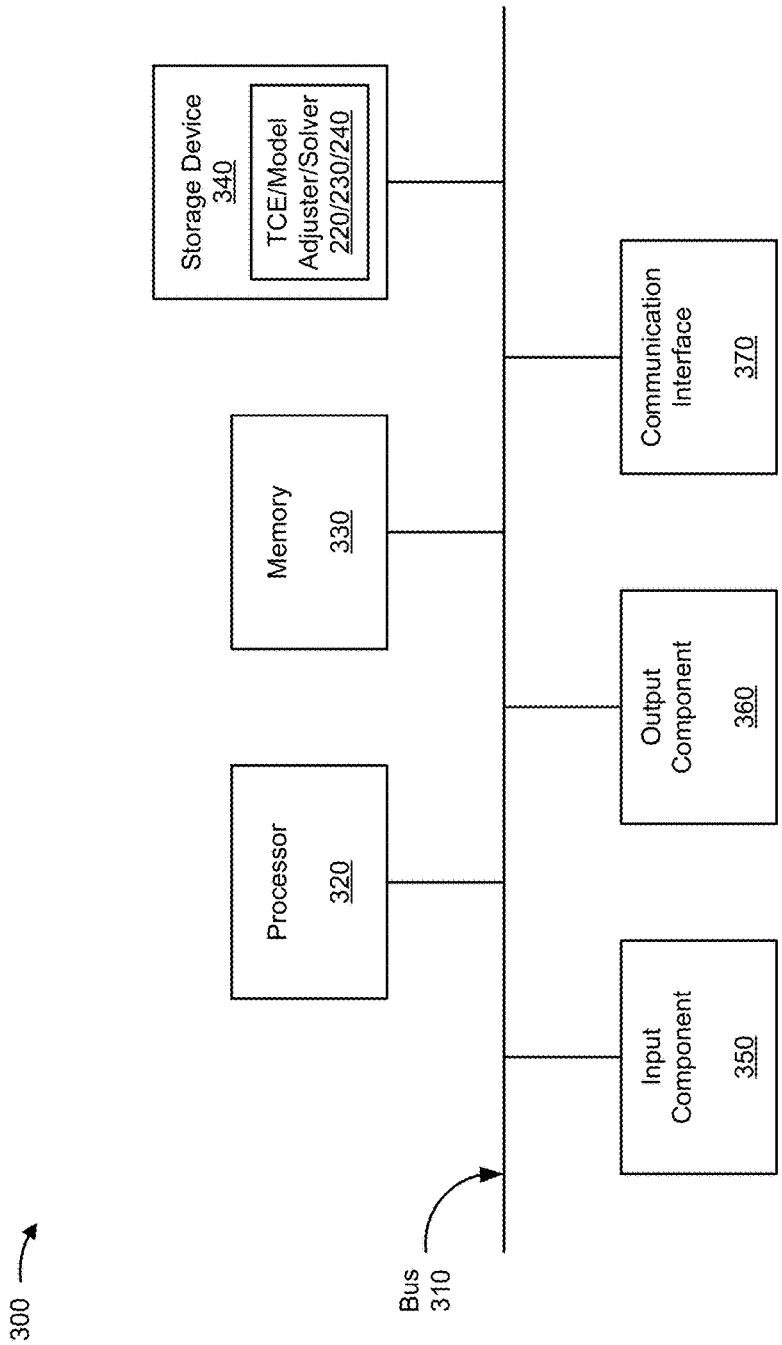
FIG. 3 is a diagram of example components of the computing device of FIG. 2.

FIG. 3 is a diagram of example components of a device 300, which may correspond to computing device 210. In some implementations, computing device 210 may include one or more devices 300 and/or one or more components of device 300. As shown in FIG. 3, device 300 may include a bus 310, a processor 320, a memory 330, a storage device 340, an input component 350, an output component 360, and a communication interface 370.

Bus 310 may include a path that permits communication among the components of device 300. Processor 320 may include a processor (e.g., a central processing unit, a graphics processing unit, an accelerated processing unit, etc.), a microprocessor, and/or any processing logic (e.g., a field-programmable gate array (FPGA), an application-specific integrated circuit (ASIC), etc.) that interprets and/or executes instructions. Memory 330 may include a random access memory (RAM), a read only memory (ROM), and/or another type of dynamic or static storage device (e.g., a flash, magnetic, or optical memory) that stores information and/or instructions for use by processor 320.

Storage device 340 may store information and/or software related to the operation and use of device 300. For example, storage device 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage device 340 may store TCE 220, model adjuster 230, and/or solver 240.

Input component 350 may include a component that permits a user to input information to device 300 (e.g., a touch screen display, a keyboard, a keypad, a mouse, a button, a switch, etc.). Output component 360 may include a component that outputs information from device 300 (e.g., a display, a speaker, one or more light-emitting diodes (LEDs), etc.).

Communication interface 370 may include a transceiver-like component, such as a transceiver and/or a separate receiver and transmitter, that enables device 300 to communicate with other devices, such as via a wired connection, a wireless connection, or a combination of wired and wireless connections. For example, communication interface 370 may include an Ethernet interface, an optical interface, a coaxial interface, an infrared interface, a radio frequency (RF) interface, a universal serial bus (USB) interface, or the like.

Device 300 may perform various operations described herein. Device 300 may perform these operations in response to processor 320 executing software instructions included in a computer-readable medium, such as memory 330 and/or storage device 340. A computer-readable medium may be defined as a non-transitory memory device. A memory device may include memory space within a single physical storage device or memory space spread across multiple physical storage devices.

Software instructions may be read into memory 330 and/or storage device 340 from another computer-readable medium or from another device via communication interface 370. When executed, software instructions stored in memory 330 and/or storage device 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number of components shown in FIG. 3 is provided as an example. In practice, device 300 may include additional components, fewer components, different components, or differently arranged components than those shown in FIG. 3. Additionally, or alternatively, one or more components of device 300 may perform one or more functions described as being performed by another one or more components of device 300.

Figure 4:
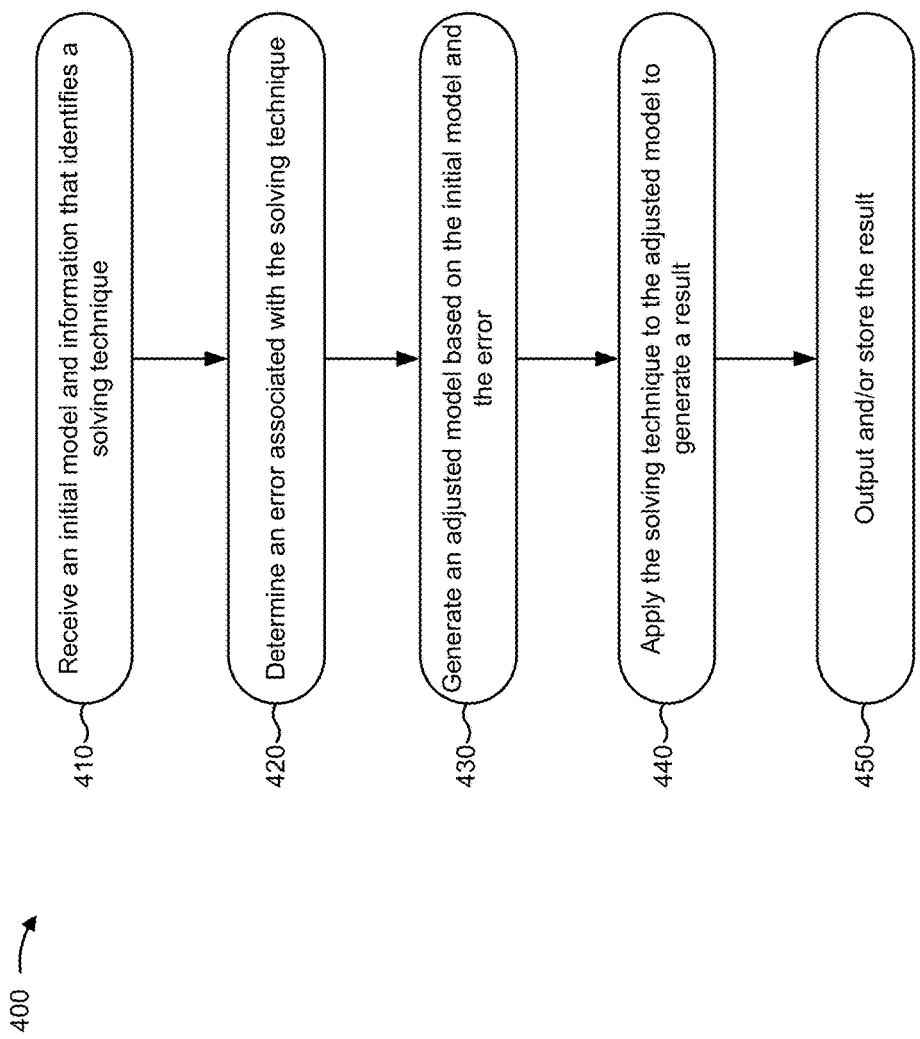
FIG. 4 is a flow chart of an example process for adjusting an initial model to generate an improved solution to the initial model.

FIG. 4 is a flow chart of an example process 400 for adjusting an initial model to generate an improved solution to the initial model. In some implementations, one or more process blocks of FIG. 4 may be performed by computing device 210. Additionally, or alternatively, one or more process blocks of FIG. 4 may be performed by another device or a group of devices separate from or including computing device 210, such as a server device in communication with computing device 210.

As shown in FIG. 4, process 400 may include receiving an initial model and information that identifies a solving technique (block 410). For example, computing device 210 (e.g., TCE 220) may receive a request, from a user of computing device 210, to access the initial model. The request may include information identifying the initial model, such as a name of the initial model, and information identifying a memory location at which the initial model is stored. The memory location may be located within computing device 210 or external to, and possibly remote from, computing device 210. Computing device 210 may, based on receiving the request, retrieve the initial model from the memory location. In some implementations, computing device 210 may provide, for display, a user interface that depicts all or a portion of the initial model. The initial model may include a model of a system that a user wants to analyze, such as a circuit, an amplifier, a filter, a mixer, an oscillator, or the like. In some implementations, the initial model may include a model of a system that processes digital signals with a direct current (DC) offset of zero.

In some implementations, the initial model may include a mathematical function, such as a transfer function, that calculates an output from the system based on an input to the system. The transfer function may include a mathematical representation, in terms of spatial or temporal frequency, of the relation between the input and the output of a system, such as a linear time-invariant system. For example, the transfer function may be represented as H(s), where s represents a variable input into the modeled system, and H represents a transfer function applied to s to calculate an output of the modeled system when the system receives input s. In some implementations, s may represent a Laplace frequency domain variable that describes input and/or output characteristics in the Laplace frequency domain, and H may represent a Laplace domain transfer function.

Additionally, or alternatively, the initial model may model a time domain problem (e.g., an analysis of a function and/or information, such as a signal, with respect to time) and/or a frequency domain problem (e.g., an analysis of a function and/or information, such as a signal, with respect to frequency). The initial model may include a mathematical representation of a physical system, and may include information required to generate a solution to the initial problem, such as input parameters.

Computing device 210 may receive user input that identifies the solving technique. For example, computing device 210 (e.g., TCE 220) may receive a request, from a user of computing device 210, to access the solving technique (e.g., solver 240). The request may include information identifying the solving technique, such as a name of the solving technique, and information identifying a memory location at which a solver that implements the solving technique is stored. The memory location may be located within computing device 210 or external to, and possibly remote from, computing device 210. Computing device 210 may, based on receiving the request, retrieve the solving technique (e.g., solver 240) from the memory location.

The solving technique may correspond to a technique that is to be applied to the initial model to generate a solution associated with an analysis of the system. For example, the solving technique may include a function, an algorithm, an integration method, an iterative process, a circuit envelope simulation, and/or another type of solving technique. When computing device 210 applies the solving technique to the initial model, the solving technique may produce an inaccurate solution. In some implementations, a user may specify a solver 240 to be used to generate a solution based on the model, and computing device 210 may determine the solving technique based on the specified solver 240.

In some implementations, the solving technique may include a forward Euler solving technique, a backward Euler solving technique, or a trapezoidal rule solving technique. These solving techniques may approximate an area under a curve f(t) in a region between t and t+h, where h is the step size of integration, as follows:

Forward Euler: $\int_{t}^{t+h} f(t) \approx hf(t)$
Backward Euler: $\int_{t}^{t+h} f(t) \approx hf(t+h)$ Trapezoidal Rule: $\int_{t}^{t+h} f(t) \approx \frac{h}{2}(f(t)+f(t+h))$ The above solving techniques approximate an integration from t to (t+h), and thus introduce error into a solution. The above solving techniques are provided as examples, and the implementations described herein are not limited to these solving techniques. Computing device 210 may receive input from a user to identify a solving technique described above and/or another solving technique. Alternatively, computing device 210 may determine a solving technique in another way, such as based on the initial model.

Additionally, or alternatively, computing device 210 may receive a constraint associated with the initial model. For example, a user may specify particular inputs to the initial model to which the solving technique is to be applied. For example, the constraint may identify one or more input ranges (e.g., time ranges, frequency ranges, Laplace domain ranges) and/or input values (e.g., time values, frequency values, Laplace domain values) of interest to the user.

As shown in FIG. 4, process 400 may include determining an error associated with the solving technique (block 420), and generating an adjusted model based on the initial model and the error (block 430). For example, the solving technique may produce a solution with a known error (e.g., when applied to a particular model), and computing device 210 may determine the error based on the solving technique. The known error may be based on an approximation used to solve a function associated with a model. In some implementations, a user may input the error. In some implementations, the error may be determined by applying the solving technique to the initial model.

Computing device 210 may use the initial model and the error to generate the adjusted model. Computing device 210 may generate the adjusted model in a manner that compensates for the error introduced by the solving technique (e.g., solver 240). For example, applying the solving technique to the adjusted model may produce a more accurate solution to a system analysis problem than when the solving technique is applied to the initial model. In some implementations, computing device 210 may determine more accurate solutions (e.g., may compensate for the error) by applying additional computing resources to generate the model. In this way, computing device 210 may drive the error to arbitrarily low levels by utilizing additional computing resources.

As an example, when a system modeled by a transfer function H(s) is input into a solver that uses a trapezoidal rule solving technique, the solver may generate an output that is actually modeled by the transfer function $$H\left(\frac{2}{h}\tanh\frac{sh}{2}\right),$$

where h is the step size of integration, due to an approximation error introduced by the trapezoidal rule solving technique. Computing device 210 may compensate for the error produced by the trapezoidal rule solving technique by inputting an adjusted model, other than H(s), into the solver. For example, computing device 210 may adjust an input to the transfer function, as follows:

$$H\left(\frac{2}{h}\text{artanh}\frac{sh}{2}\right).$$

Computing device 210 may input this adjusted model into solver 240 rather than the initial model H(s). The adjusted input may be an inverse of the error introduced by the solving technique, thus cancelling out the error and providing a more accurate solution to H(s).

In some implementations, computing device 210 may generate the adjusted model by changing a variable s input into a transfer function H in the initial model H(s). For example, the adjusted model may be represented by H(r) and/or H(r(s)), where r represents the adjusted variable input into the transfer function H, and where r is a function of s. Additionally, or alternatively, computing device 210 may generate the adjusted model by changing the transfer function H applied to the variable s. For example, the adjusted model may be represented by $H_{adj}(s)$, where s represents a variable input into the transfer function $H_{adj}$. In some implementations, computing device 210 may generate the adjusted model by changing both the transfer function H and the variable s input into the transfer function. For example, the adjusted model may be represented by $H_{adj}(r)$.

As further shown in FIG. 4, process 400 may include applying the solving technique to the adjusted model to generate a result (block 440), and outputting and/or storing the result (block 450). For example, computing device 210 may apply the solving technique to the adjusted model, such as by inputting the adjusted model into solver 240, to determine a result (e.g., a solution), and may output and/or store the result. As described above, computing device 210 may input the adjusted model $$H\left(\frac{2}{h}\text{artanh}\frac{sh}{2}\right)$$

into solver 240 rather than the initial model H(s). Inputting the adjusted model may compensate for the error introduced by the solver when applying the trapezoidal rule solving technique to the initial model H(s), thereby decreasing the error.

In some implementations, computing device 210 may compensate for errors introduced by a forward Euler solving technique, a backward Euler solving technique, and a trapezoidal rule solving technique according to the following table:

| Solving technique and approximation method | Adjusted model |
|---|---|
| Forward Euler: $\int_t^{t+h} f(t) \approx hf(t)$ | $H(r) \to H(s) \Rightarrow r = \frac{1}{h}\log(1+sh)$ |
| Backward Euler: $\int_t^{t+h} f(t) \approx hf(t+h)$ | $H(r) \to H(s) \Rightarrow r = -\frac{1}{h}\log(1-sh)$ |
| Trapezoidal Rule: $\int_t^{t+h} f(t) \approx \frac{h}{2}(f(t)+f(t+h))$ | $H(r) \to H(s) \Rightarrow r = \frac{2}{h}\text{artanh}\frac{sh}{2}$ |

For example, computing device 210 may input H(r) into solver 240 instead of H(s).

In some implementations, H(r) may be difficult to solve, and computing device 210 may use an approximation of H(r), r(s), and/or a term in H(r) or r(s), such as a logarithm or artanh. For example, computing device 210 may approximate H(r) using a ratio of polynomials:

$$H(r) = \frac{N(r)}{D(r)} = \frac{b_0 + b_1 r + \ldots + b_m r^m}{a_0 + a_1 r + \ldots + a_n r^n}.$$

Additionally, or alternatively, computing device 210 may approximate r using a ratio of polynomials:

$$r(s) = \frac{P(s)}{Q(s)} = \frac{\alpha_0 + \alpha_1 s + \ldots + \alpha_\mu s^\mu}{\beta_0 + \beta_1 s + \ldots + \beta_\nu s^\nu}.$$

Computing device 210 may approximate a term of H(r) and/or r(s) by using a function with a stable approximant. For example, computing device 210 may approximate a term (e.g., log(1+sh)) using a Padé approximant. As another example, computing device 210 may approximate a term (e.g., artanh(s)) using a polynomial expansion, such as:

$$\text{artanh}(s) \approx \tfrac{1}{2}\log(1+2s+2s^2+s^3).$$

While a series of blocks has been described with regard to FIG. 4, the blocks and/or the order of the blocks may be modified in some implementations. Additionally, or alternatively, non-dependent blocks may be performed in parallel.

FIGS. 5A-5F are diagrams of an example implementation 500 relating to example process 400 (FIG. 4). In example implementation 500, assume that a user wants to simulate a magnitude response of a two-port LC bandpass filter across a particular frequency range.

Figure 5A:
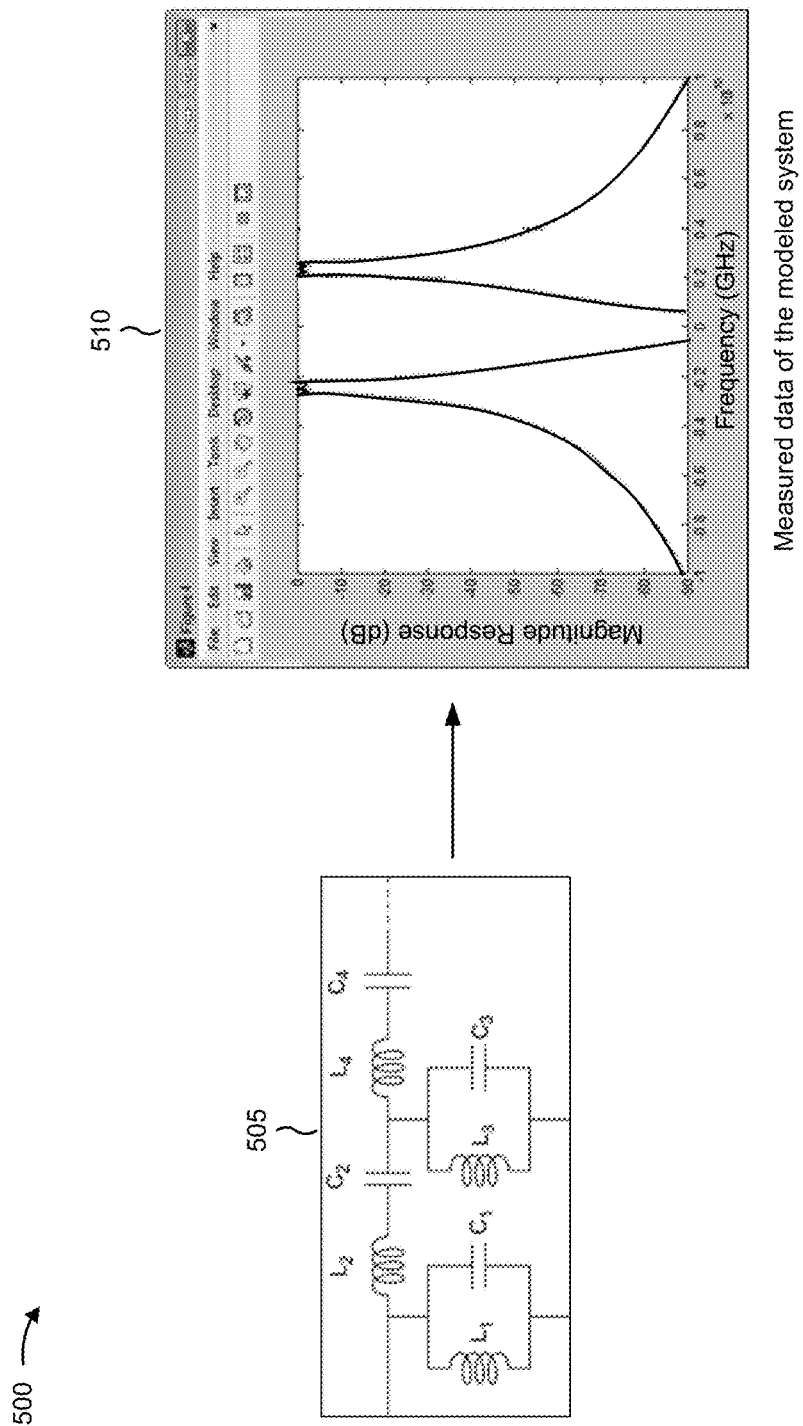
FIGS. 5A-5F are diagrams of an example implementation relating to the example process shown in FIG. 4.

As shown in FIG. 5A, a user may create a graphical model 505, such as a block diagram model or a circuit diagram, of a system to be analyzed. In some implementations, the user may create model 505 using computing device 210. Additionally, or alternatively, computing device 210 may receive model 505 via other user input (e.g., selecting and/or loading model 505) and/or may receive model 505 from another device (e.g., a server device in communication with computing device 210). In example implementation 500, assume that model 505 is a model of a two-port LC bandpass filter.

Graph 510 may represent data measured from the system modeled by model 505. In example implementation 500, graph 510 may represent a magnitude response (e.g., in decibels, shown along the y-axis) of the LC bandpass filter across the entire frequency range (e.g., in hertz, gigahertz, etc., shown along the x-axis) in which the LC bandpass filter operates. In some implementations, the measured data shown on graph 510 may be input by a user and/or may be simulated based on model 505.

Figure 5B:
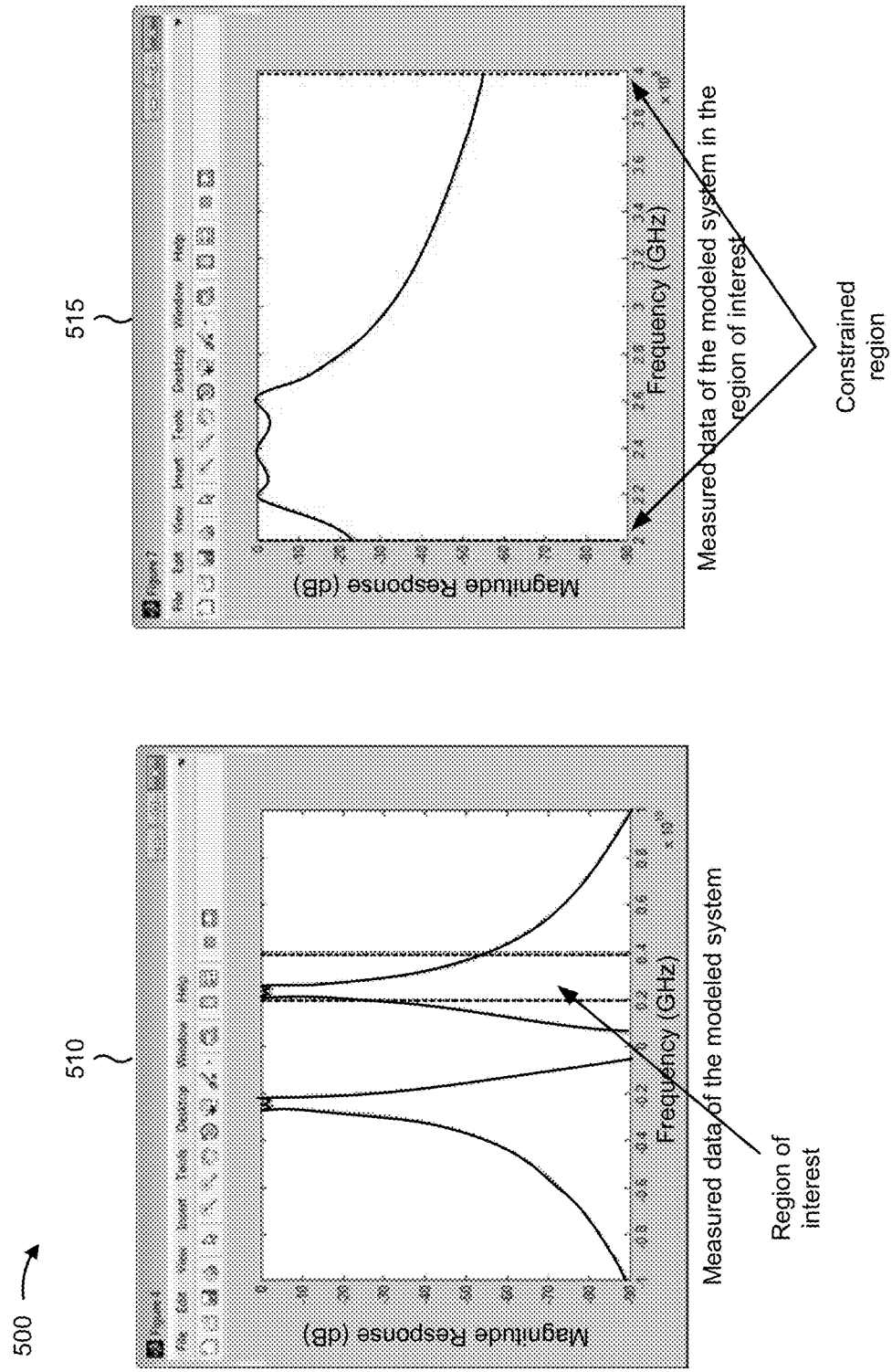

As shown in FIG. 5B, the user may specify a region of the measured data in which the user is interested. In example implementation 500, assume the user has constrained the region of interest to an area between 2 and 4 gigahertz (GHz), as shown. In some implementations, the region of interest constraint may be based on the system modeled by model 505. For example, the system may only be stimulated across a limited range of frequencies, and computing device 210 may automatically determine the region of interest constraint based on this range of frequencies.

If the user were to build the LC bandpass filter modeled by model 505 and test the LC bandpass filter in the region of interest (e.g., measure magnitude response outputs based on frequency inputs between 2 gigahertz and 4 gigahertz), the result would look like graph 515. Graph 515 represents a zoomed-in portion of graph 510 between 2 and 4 gigahertz. Graph 515 may represent the magnitude response outputs generated by applying the transfer function H(s) to inputs s, which may include and/or may be based on the frequencies of signals input to the system. However, if the user were to simulate the outputs of the LC bandpass filter modeled by model 505, using solver 240, the result would not look like graph 515 due to an error introduced by a solving technique used by solver 240.

Figure 5C:
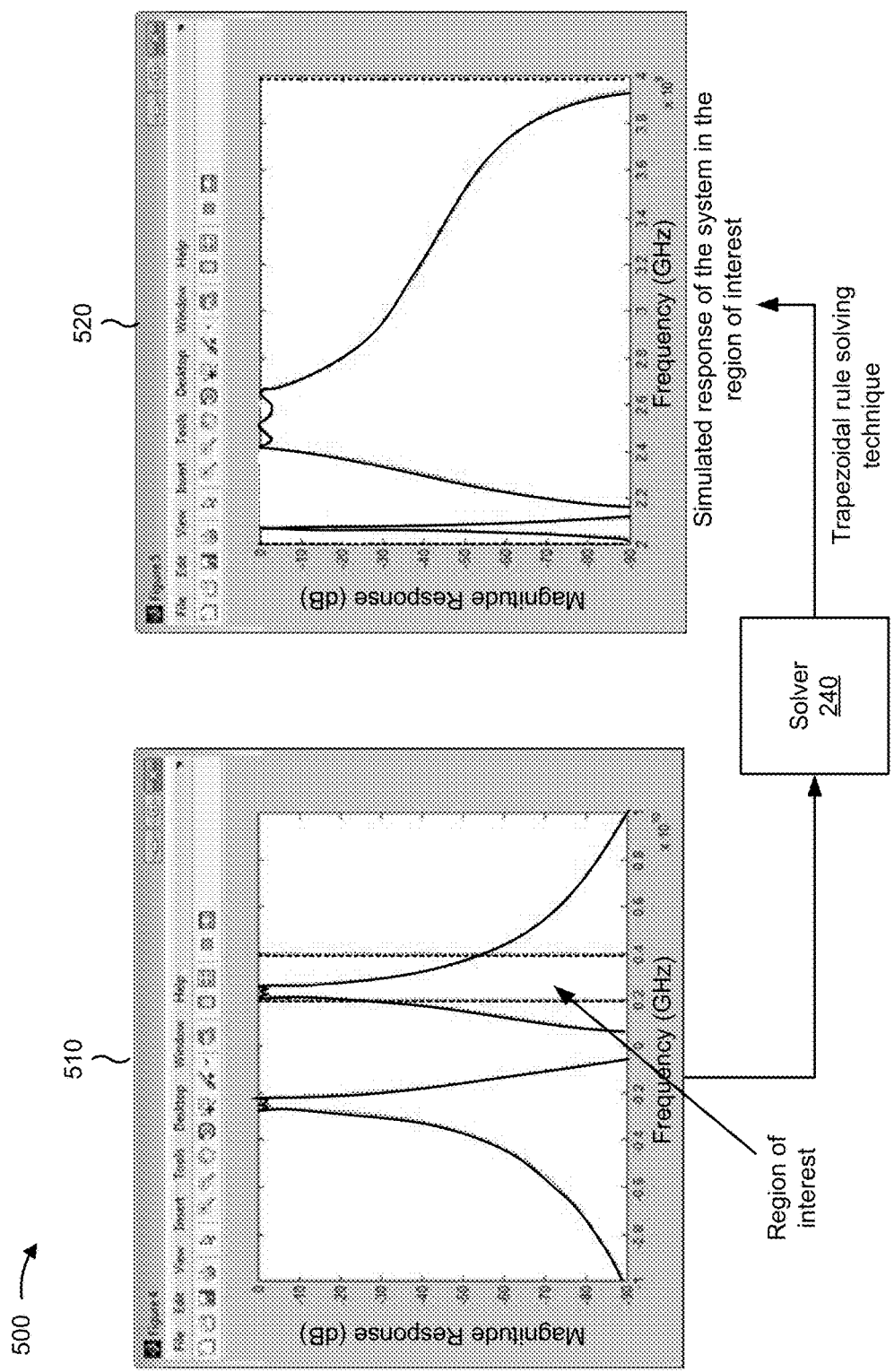

As shown in FIG. 5C, if the user were to simulate the outputs of the LC bandpass filter modeled by model 505, using solver 240, the result may be represented by graph 520. In example implementation 500, assume that solver 240 uses a trapezoidal rule solving technique to simulate model 505. As a result of the error introduced by the trapezoidal rule solving technique, the simulated response of the system, shown by graph 520, is different from the actual response of the system, shown by graph 515 (FIG. 5B). Graph 520 may represent the magnitude response outputs generated by applying the transfer function $$H\left(\frac{2}{h}\tanh\frac{sh}{2}\right)$$

to inputs s.

Figure 5D:
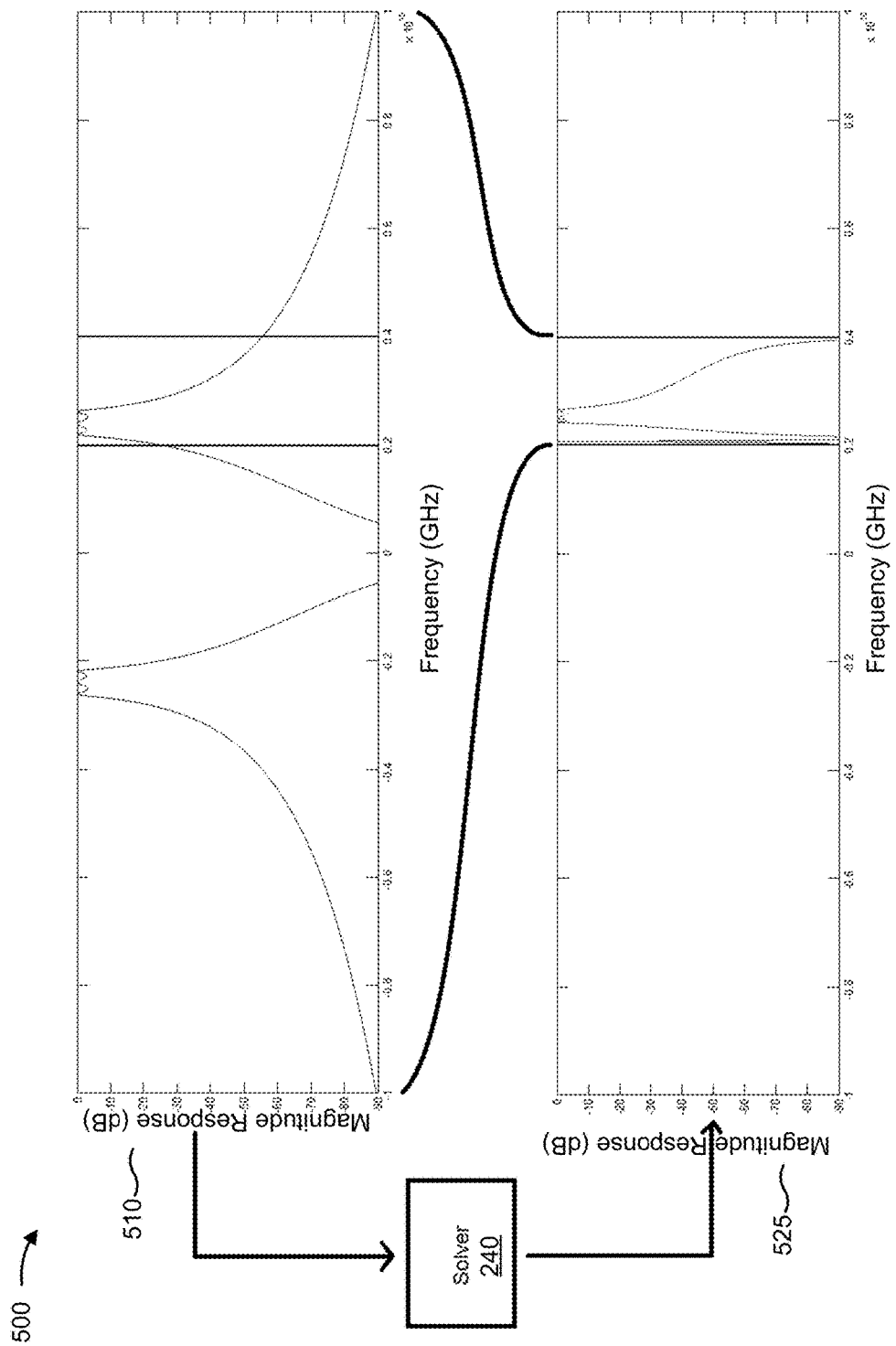

As shown in FIG. 5D, the error introduced in the simulated response of the system may be due to a frequency warping effect resulting from applying the trapezoidal rule solving technique to model 505. The trapezoidal rule solving technique may take into account the entire frequency domain shown on graph 510, rather than only the region of interest specified by the user. The result of the simulation may produce graph 525, which may be equivalent to graph 520 across the region of interest from 2 gigahertz to 4 gigahertz.

Figure 5E:
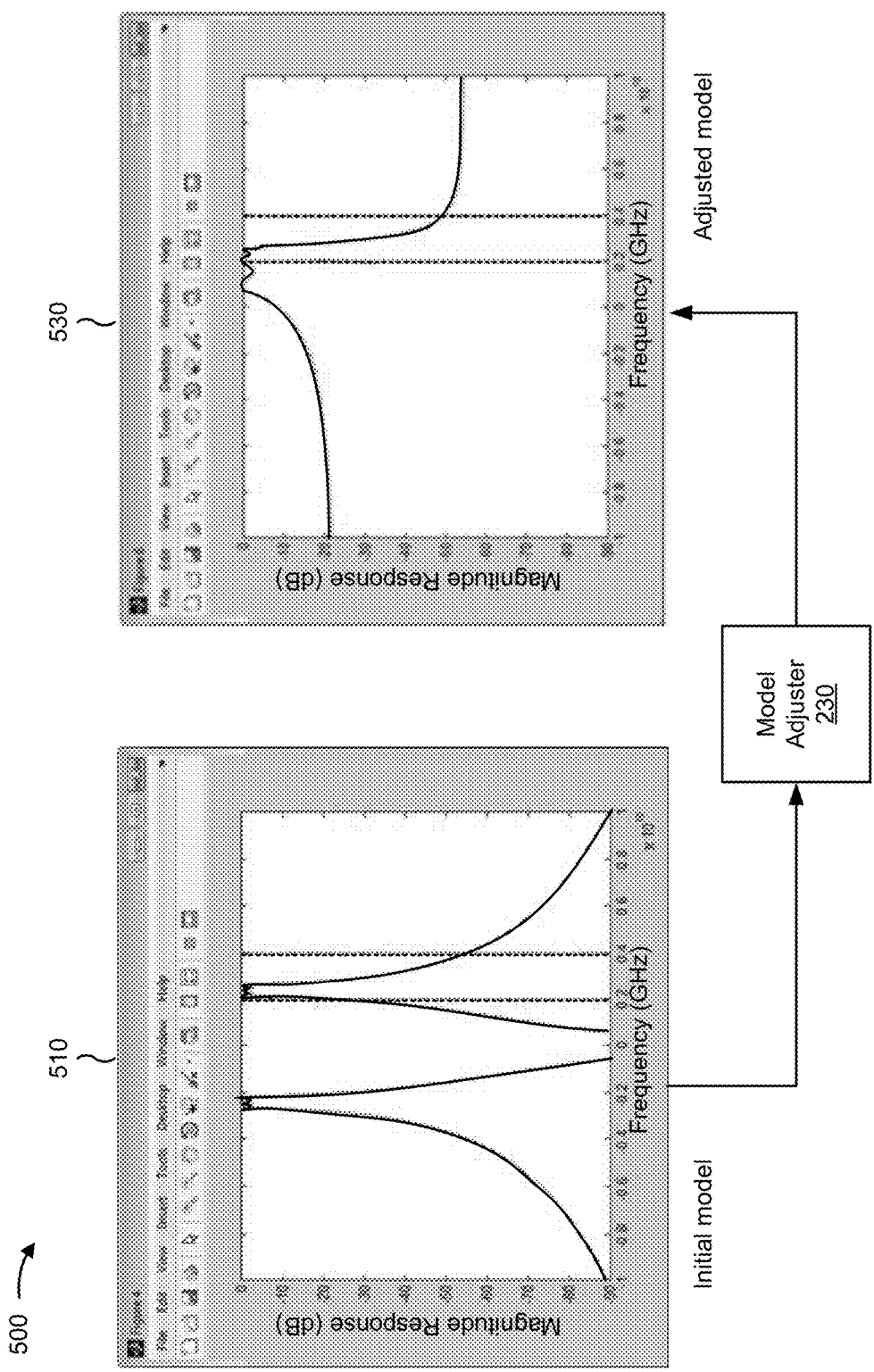

As shown in FIG. 5E, computing device 210 may counteract the error introduced by the trapezoidal rule solving technique by adjusting a representation of model 505 using model adjuster 230. As shown, model adjuster 230 may adjust a representation of the inputs (frequencies) and/or outputs (magnitude response), of the system, from the relationship depicted by graph 510 to the relationship depicted by graph 530. Graph 530 may represent the magnitude response outputs generated by applying the transfer function $$H\left(\frac{2}{h}\text{artanh}\frac{sh}{2}\right)$$

to inputs s, which may counteract the error introduced by the trapezoidal rule solving technique.

For example, the actual measured output is modeled by H(s), and the trapezoidal rule solving technique results in an output modeled by $$H\left(\frac{2}{h}\tanh\frac{sh}{2}\right).$$

The transfer function $$H\left(\frac{2}{h}\tanh\frac{sh}{2}\right)$$

may be converted to H(s) by calculating $$H\left(\frac{2}{h}\tanh\frac{ah}{2}\right),$$

where $$a = \frac{2}{h}\text{artanh}\frac{sh}{2}.$$

In this manner, model adjuster 230 may counteract the error introduced by solver 240 by inputting a term into the transfer function that represents an inverse of the error.

Figure 5F:
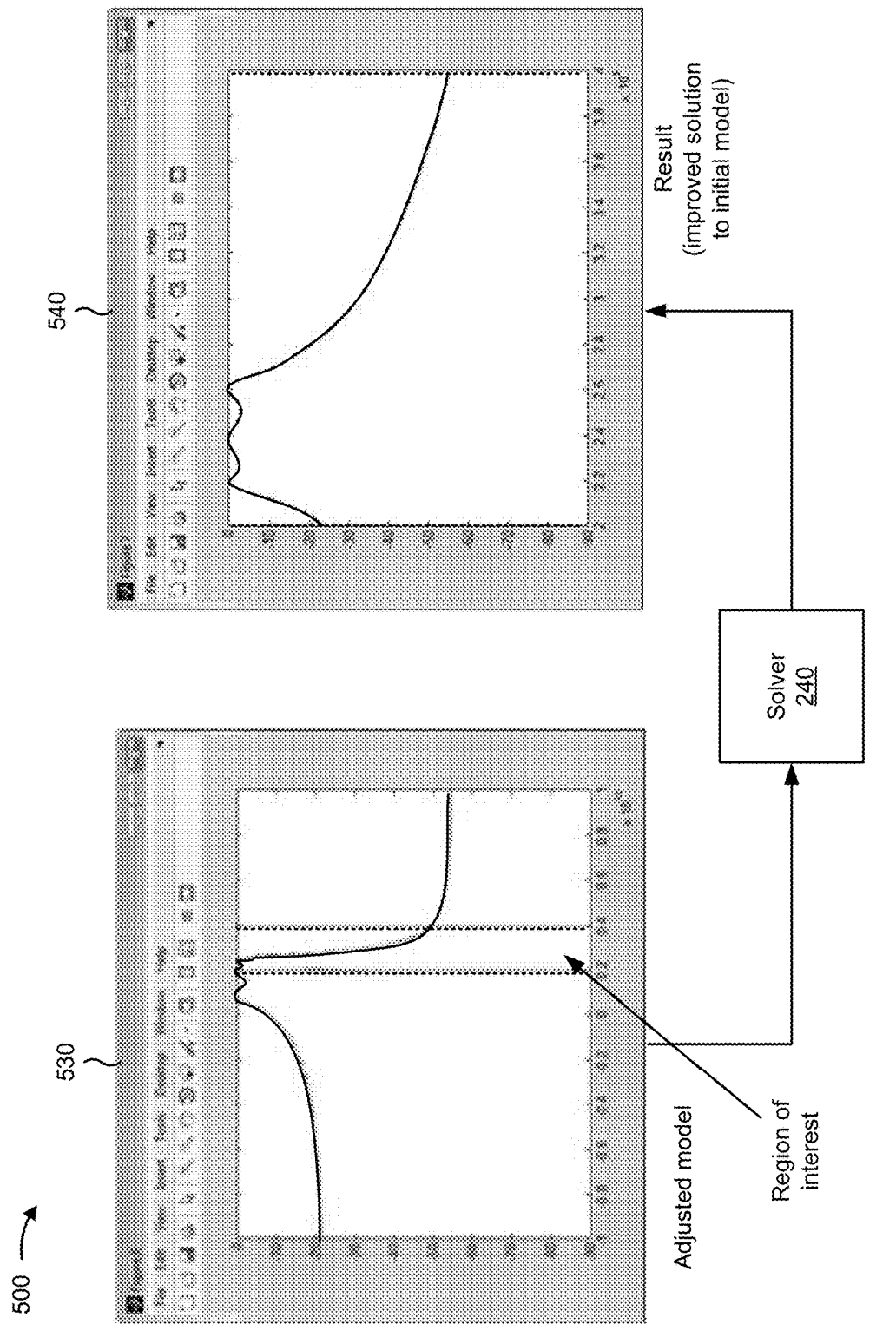

As shown by FIG. 5F, when solver 240 applies the trapezoidal rule solving technique to the adjusted model represented by graph 530, a result 540 may represent an improved solution to the initial model.

FIGS. 6A-6D are diagrams of other example implementations 600A-600D relating to example process 400 (FIG. 4). Example implementations 600A-600D show how model adjuster 230 may adjust an initial model that may be simulated using a forward Euler solver, a backward Euler solver, and a trapezoidal rule solver.

Figure 6A:
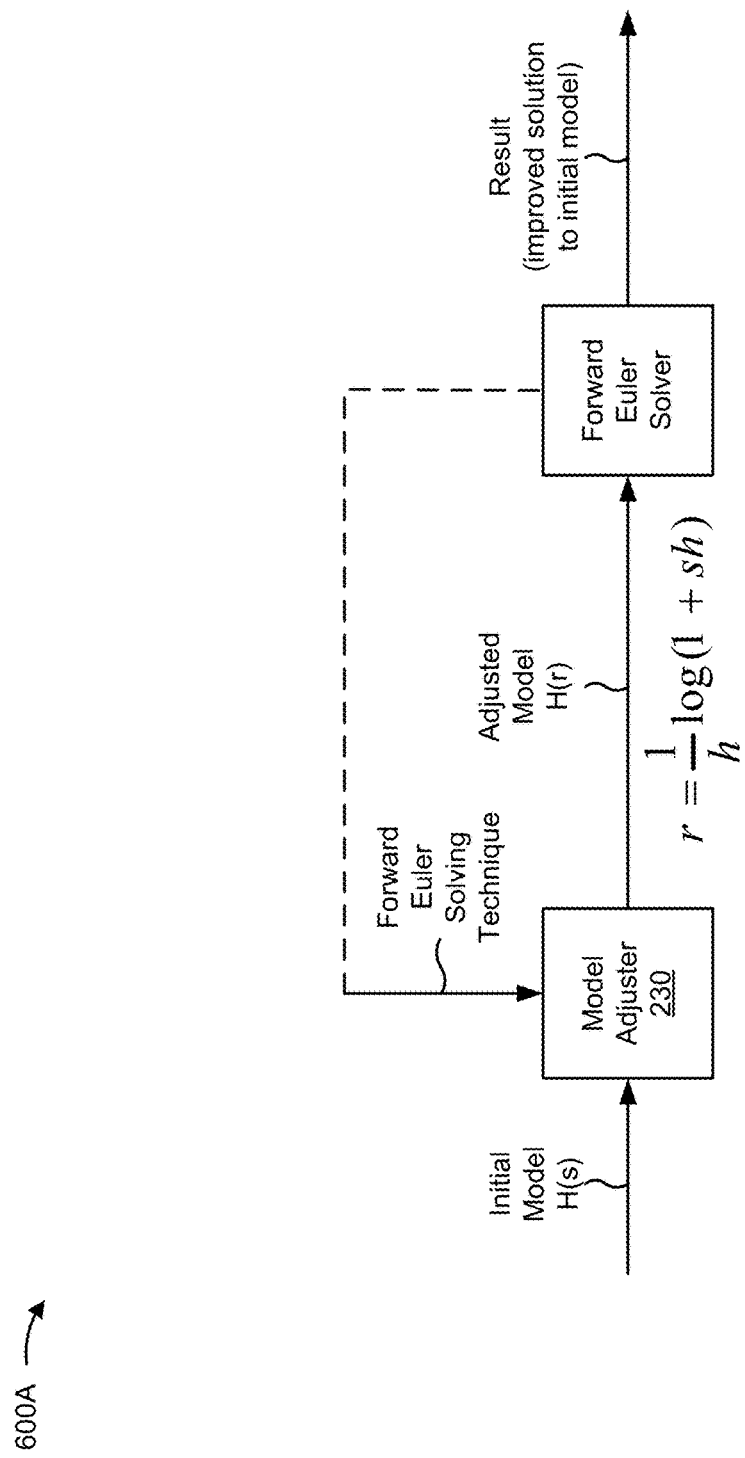
FIGS. 6A-6D are diagrams of other example implementations relating to the example process shown in FIG. 4.

As shown in FIG. 6A, computing device 210 may use a forward Euler solver to simulate a model of a system. For example, a user may select a forward Euler solver as a solving technique to be used by solver 240. Model adjuster 230 may receive an initial model H(s), and may receive information that identifies the forward Euler solving technique. Model adjuster 230 may adjust the initial model H(s) to produce an adjusted model H(r), where $$r = \frac{1}{h}\log(1 + sh).$$

Model adjuster 230 may provide the adjusted model H(r) to the forward Euler solver, which may simulate adjusted model H(r) to produce a result. The result may represent an improved solution to initial model H(s).

Figure 6B:
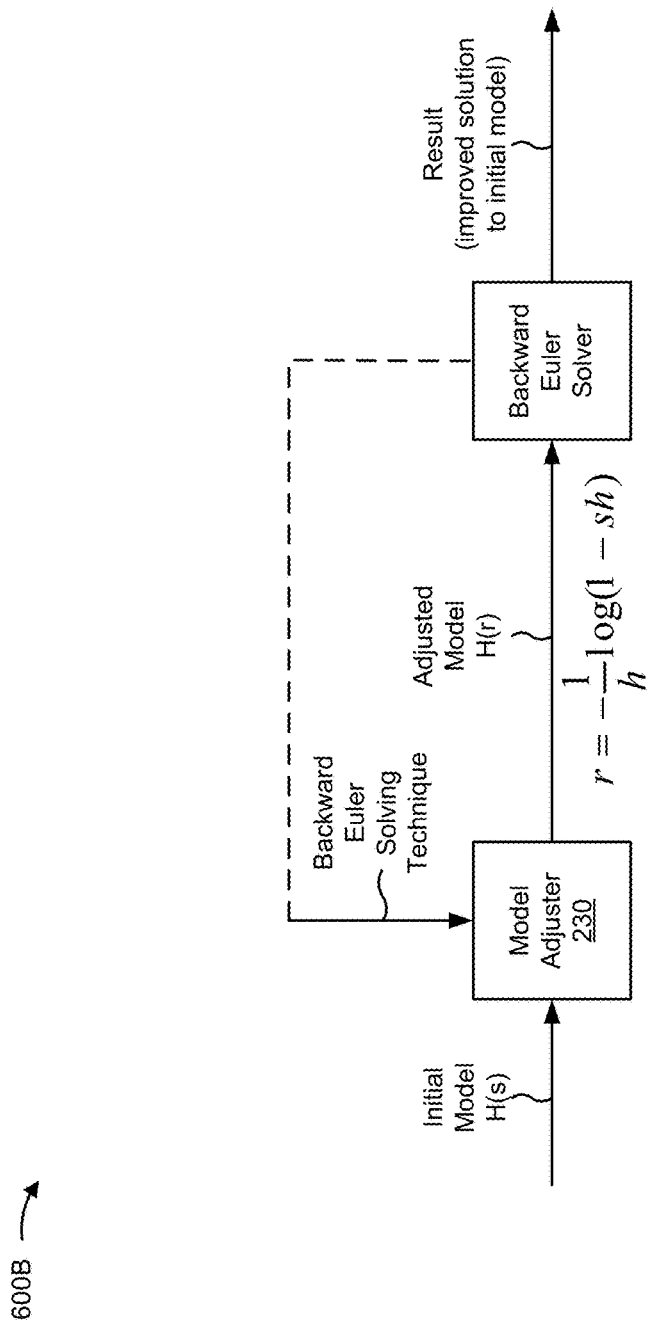

As shown in FIG. 6B, computing device 210 may use a backward Euler solver to simulate a model of a system. For example, a user may select a backward Euler solver as a solving technique to be used by solver 240. Model adjuster 230 may receive an initial model H(s), and may receive information that identifies the backward Euler solving technique. Model adjuster 230 may adjust the initial model H(s) to produce an adjusted model H(r), where $$r = -\frac{1}{h}\log(1 - sh).$$

Model adjuster 230 may provide the adjusted model H(r) to the backward Euler solver, which may simulate adjusted model H(r) to produce a result. The result may represent an improved solution to initial model H(s).

Figure 6C:
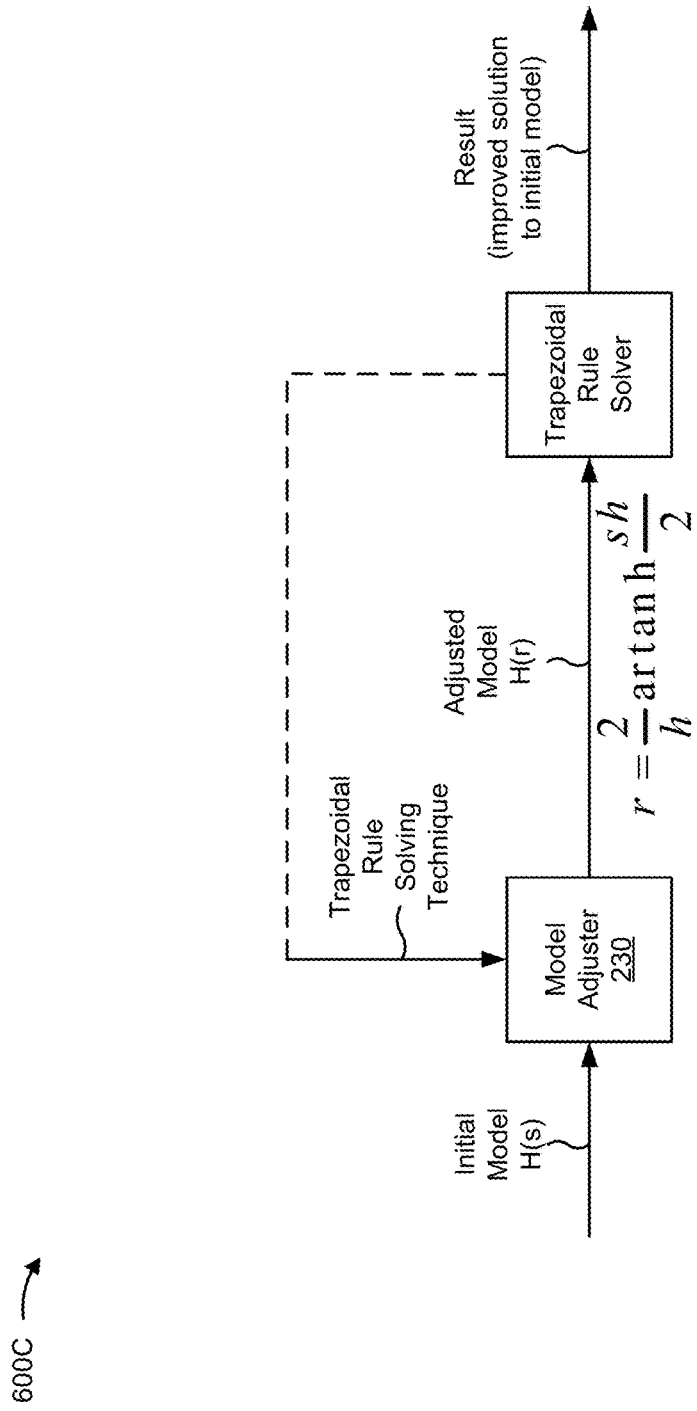

As shown in FIG. 6C, computing device 210 may use a trapezoidal rule solver to simulate a model of a system. For example, a user may select a trapezoidal rule solver as a solving technique to be used by solver 240. Model adjuster 230 may receive an initial model H(s), and may receive information that identifies the trapezoidal rule solving technique. Model adjuster 230 may adjust the initial model H(s) to produce an adjusted model H(r(s)), where $$r(s) = \frac{2}{h}\text{artanh}\frac{sh}{2}.$$

Model adjuster 230 may provide the adjusted model H(r) to the trapezoidal rule solver, which may simulate adjusted model H(r(s)) to produce a result. The result may represent an improved solution to initial model H(s).

Figure 6D:
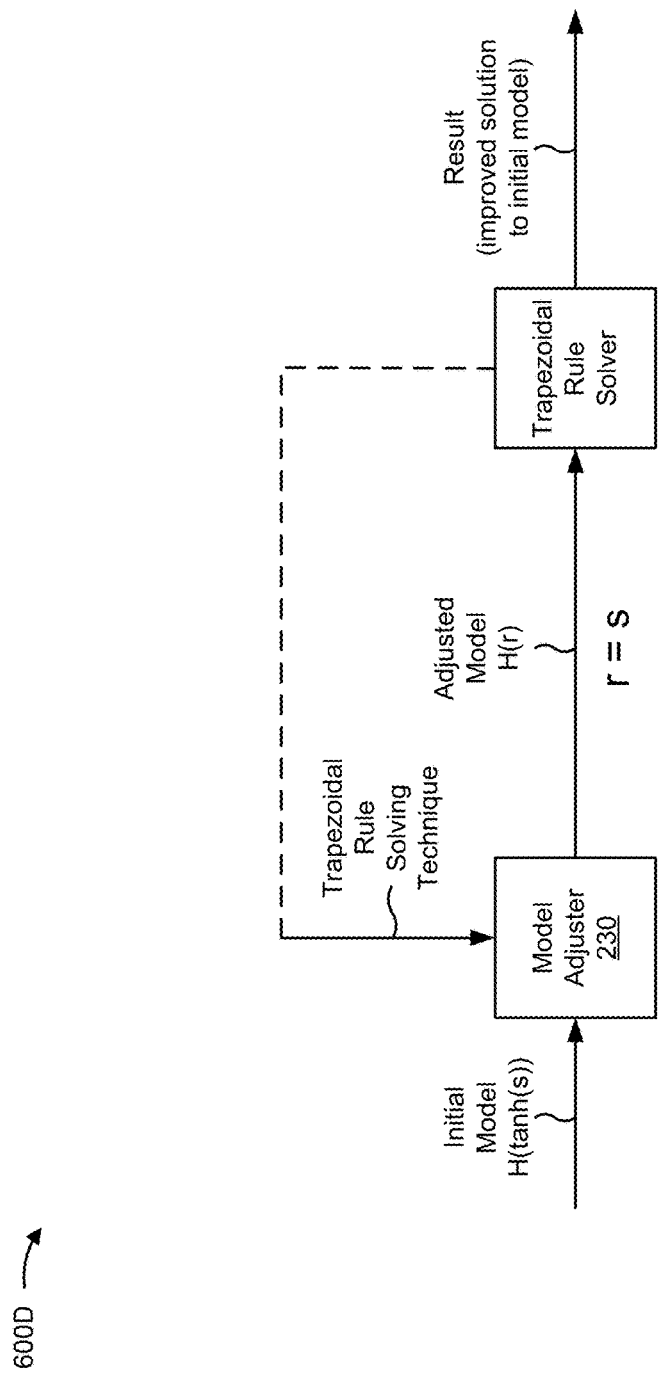

As shown in FIG. 6D, computing device 210 may use a trapezoidal rule solver to simulate a model of a system modeled as H(tanh(s)). An example of a system modeled via H(tanh(s)) may include a transmission line. A user may select a trapezoidal rule solver as a solving technique to be used by solver 240. Model adjuster 230 may receive an initial model H(tanh(s)), and may receive information that identifies the trapezoidal rule solving technique. Model adjuster 230 may adjust the initial model H(tanh(s)) to produce an adjusted model H(r), where r=s. Model adjuster 230 may provide the adjusted model H(r) to the trapezoidal rule solver, which may simulate adjusted model H(r) to produce a result. The result may represent an improved solution to initial model H(tanh(s)).

The foregoing disclosure provides illustration and description, but is not intended to be exhaustive or to limit the implementations to the precise form disclosed. Modifications and variations are possible in light of the above disclosure or may be acquired from practice of the implementations.

As used herein, component is intended to be broadly construed as hardware, firmware, or a combination of hardware and software.

It will be apparent that systems and/or methods, as described herein, may be implemented in many different forms of software, firmware, and hardware in the implementations illustrated in the figures. The actual software code or specialized control hardware used to implement these systems and/or methods is not limiting of the implementations. Thus, the operation and behavior of the systems and/or methods were described without reference to the specific software code—it being understood that software and control hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A device, comprising:
   one or more processors to:
      receive an initial model of a system and information that identifies a solving technique to be used to solve a mathematical problem associated with the initial model,
         the system being modeled including an electrical component,
         the initial model including an initial transfer function that describes a relationship between an input to the system and an output from the system;
      determine an error produced by using the solving technique to solve the mathematical problem associated with the initial model,
         the error resulting in an inaccurate solution to the mathematical problem;
      receive a constraint,
         the constraint identifying a frequency range of interest;
      generate an adjusted model of the system based on the initial model, the error, and the constraint,
         the adjusted model including an adjusted variable input to the system that compensates for the error produced by using the solving technique, based on the input to the system and the error;
      apply the solving technique to the adjusted model to generate a result,
         the result including a more accurate solution to the mathematical problem than applying the solving technique to the initial model; and
      output or store the result.

2. The device of claim 1, where the adjusted variable input includes an approximate term; and
   where the one or more processors, when generating the adjusted model and applying the solving technique, are to:
      estimate the approximate term based on at least one of:
         a polynomial expansion;
         a ratio of polynomials;
         a function with a stable approximant; or
         a Padé approximant; and
      apply the solving technique to the adjusted model,
         the adjusted model including the estimate of the approximate term.

3. The device of claim 1, where the initial model is represented by H(s), where H represents the initial transfer function and s represents a Laplace frequency domain variable, and the adjusted model is represented by at least one of:
   H(r(s)), where r represents an adjusted Laplace frequency domain variable to the system and is a function of s; or
   $H_{adj}$(r(s)), where $H_{adj}$ represents an adjusted transfer function and r represents the adjusted Laplace frequency domain variable to the system and is a function of s.

4. The device of claim 3, where the solving technique includes a forward Euler solving technique that approximates an area under a curve from t to t+h, where h is a step size of integration, according to:

$$\int_t^{t+h} f(t) \approx hf(t);$$

and where the one or more processors, when generating the adjusted model and applying the solving technique, are to:
   adjust the Laplace frequency domain variable s to produce the adjusted Laplace frequency domain variable r(s), where $$r(s) = \frac{1}{h}\log(1 + sh);$$

and
apply the solving technique to the adjusted model,
   the adjusted model including the adjusted Laplace frequency domain variable r(s).

5. The device of claim 3, where the solving technique includes a backward Euler solving technique that approximates an area under a curve from t to t+h, where h is a step size of integration, according to:

$$\int_t^{t+h} f(t) \approx hf(t+h);$$

and where the one or more processors, when generating the adjusted model and applying the solving technique, are to:
   adjust the Laplace frequency domain variable s to produce the adjusted Laplace frequency domain variable r(s), where $$r(s) = -\frac{1}{h}\log(1 - sh);$$

and
apply the solving technique to the adjusted model,
   the adjusted model including the adjusted Laplace frequency domain variable r(s).

6. The device of claim 3, where the solving technique includes a trapezoidal rule solving technique that approximates an area under a curve from t to t+h, where h is a step size of integration, according to:

$$\int_t^{t+h} f(t) \approx h/2[f(t)+f(t+h)];$$

and where the one or more processors, when generating the adjusted model and applying the solving technique, are to:
adjust the Laplace frequency domain variable s to produce the adjusted Laplace frequency domain variable r(s), where $$r(s) = \frac{2}{h}\text{artanh}\left(\frac{sh}{2}\right);$$

and
apply the solving technique to the adjusted model,
the adjusted model including the adjusted Laplace frequency domain variable r(s).

7. The device of claim 1, where the system is a linear time-invariant system.

8. A non-transitory computer-readable medium storing instructions, the instructions comprising:
one or more instructions that, when executed by a processor, cause the processor to:
receive an initial model of a system and information that identifies a solver to be used to solve a mathematical problem associated with the initial model, the system being modeled including an electrical component,
the initial model including an initial transfer function that describes a relationship between an input to the system and an output from the system;
determine an error produced by using the solver to solve the mathematical problem associated with the initial model,
the error resulting in an inaccurate solution to the mathematical problem;
receive a constraint,
the constraint identifying a frequency range of interest;
generate an adjusted model of the system based on the initial model, the error, and the constraint,
the adjusted model including an adjusted variable input to the system that compensates for the error produced by using the solver, based on the input to the system and the error;
analyze the adjusted model, using the solver, to generate a result,
the result including a more accurate solution to the mathematical problem than an initial result of inputting the initial model into the solver; and
output or store the result.

9. The non-transitory computer-readable medium of claim 8, where the adjusted variable input includes an approximate term; and
where the one or more instructions, that cause the processor to generate the adjusted model and input the adjusted model into the solver, cause the processor to:
estimate the approximate term based on at least one of:
a polynomial expansion;
a ratio of polynomials;
a function with a stable approximant; or
a Padé approximant; and
analyze the adjusted model using the solver,
the adjusted model including the estimate of the approximate term.

10. The non-transitory computer-readable medium of claim 8, where the initial model is represented by H(s), where H represents the initial transfer function and s represents a Laplace frequency domain variable, and the adjusted model is represented by at least one of:
H(r(s)), where r represents an adjusted Laplace frequency domain variable to the system and is a function of s; or
$H_{adj}$(r(s)), where $H_{adj}$ represents an adjusted transfer function and r represents the adjusted Laplace frequency domain variable to the system and is a function of s.

11. The non-transitory computer-readable medium of claim 10, where the solver includes a forward Euler solver that approximates an area under a curve from t to t+h, where h is a step size of integration, according to:

$$\int_t^{t+h} f(t) \approx hf(t);$$

and where the one or more instructions, that cause the processor to generate the adjusted model and analyze the adjusted model using the solver, cause the processor to:
adjust the Laplace frequency domain variable s to produce the adjusted Laplace frequency domain variable r(s), where $$r(s) = \frac{1}{h}\log(1 + sh);$$

and
analyze the adjusted model using the solver,
the adjusted model including the adjusted Laplace frequency domain variable r(s).

12. The non-transitory computer-readable medium of claim 10, where the solver includes a backward Euler solver that approximates an area under a curve from t to t+h, where h is a step size of integration, according to:

$$\int_t^{t+h} f(t) \approx hf(t+h);$$

and where the one or more instructions, that cause the processor to generate the adjusted model and analyze the adjusted model using the solver, cause the processor to:
adjust the Laplace frequency domain variable s to produce the adjusted Laplace frequency domain variable r(s), where $$r(s) = -\frac{1}{h}\log(1 - sh);$$

and
analyze the adjusted model using the solver,
the adjusted model including the adjusted Laplace frequency domain variable r(s).

13. The non-transitory computer-readable medium of claim 10, where the solver includes a trapezoidal rule solver that approximates an area under a curve from t to t+h, where h is a step size of integration, according to:

$$\int_t^{t+h} f(t) \approx \frac{h}{2}[f(t) + f(t+h)];$$

and where the one or more instructions, that cause the processor to generate the adjusted model and analyze the adjusted model using the solver, cause the processor to:

adjust the Laplace frequency domain variable s to produce the adjusted Laplace frequency domain variable r(s), where $$r(s) = \frac{2}{h} artanh\left(\frac{sh}{2}\right);$$

and
analyze the adjusted model using the solver,
the adjusted model including the adjusted Laplace frequency domain variable r(s).

14. The non-transitory computer-readable medium of claim 8, where the system is a linear time-invariant system.

15. A method, comprising:
receiving an initial model of a system and information that identifies a solving technique to be used to generate an approximate solution associated with the initial model,
the system being modeled including an electrical component,
the initial model including an initial transfer function that describes a relationship between an input to the system and an output from the system,
the receiving the initial model being performed by a device;
determining an error produced by using the solving technique to generate the approximate solution associated with the initial model,
the error being associated with the approximate solution,
the determining being performed by the device;
receiving a constraint,
the constraint identifying a frequency range of interest,
the receiving the constraint being performed by the device;
generating an adjusted model of the system based on the initial model, the error, and the constraint,
the adjusted model including an adjusted variable input to the system that compensates for the error produced by using the solving technique, based on the input to the system and the error,
the generating being performed by the device;
applying the solving technique to the adjusted model to generate a result,
the result including a more accurate solution associated with the initial model than the approximate solution,
the applying being performed by the device; and
outputting or storing the result,
the outputting or storing being performed by the device.

16. The method of claim 15, where the initial model is represented by H(s), where H represents the initial transfer function and s represents a Laplace frequency domain variable, and the adjusted model is represented by at least one of:
H(r(s)), where r represents an adjusted Laplace frequency domain variable to the system and is a function of s; or
$H_{adj}$(r(s)), where $H_{adj}$ represents an adjusted transfer function and r represents the adjusted Laplace frequency domain variable to the system and is a function of s.

17. The method of claim 16, where the solving technique includes a forward Euler solving technique that approximates an area under a curve from t to t+h, where h is a step size of integration, according to:

$$\int_t^{t+h} f(t) \approx hf(t);$$

and where generating the adjusted model and applying the solving technique comprises:
adjusting the Laplace frequency domain variable s to produce the adjusted Laplace frequency domain variable r(s), where $$r(s) = \frac{1}{h}\log(1 + sh);$$

and
applying the solving technique to the adjusted model,
the adjusted model including the adjusted Laplace frequency domain variable r(s).

18. The method of claim 16, where the solving technique includes a backward Euler solving technique that approximates an area under a curve from t to t+h, where h is a step size of integration, according to:

$$\int_t^{t+h} f(t) \approx hf(t+h);$$

and where generating the adjusted model and applying the solving technique comprises:
adjusting the Laplace frequency domain variable s to produce the adjusted Laplace frequency domain variable r(s), where $$r(s) = -\frac{1}{h}\log(1 - sh);$$

and
applying the solving technique to the adjusted model,
the adjusted model including the adjusted Laplace frequency domain variable r(s).

19. The method of claim 16, where the solving technique includes a trapezoidal rule solving technique that approximates an area under a curve from t to t+h, where h is a step size of integration, according to:

$$\int_t^{t+h} f(t) \approx \frac{h}{2}[f(t) + f(t+h)];$$

and where generating the adjusted model and applying the solving technique comprises:
adjusting the Laplace frequency domain variable s to produce the adjusted Laplace frequency domain variable r(s), where $$r(s) = \frac{2}{h}artanh\left(\frac{sh}{2}\right);$$

and
applying the solving technique to the adjusted model,
the adjusted model including the adjusted Laplace frequency domain variable r(s).

20. The method of claim 15, where the system is a linear time-invariant system.

* * * * *

UNITED STATES PATENT AND TRADEMARK OFFICE
CERTIFICATE OF CORRECTION

PATENT NO. : 9,588,938 B1  
APPLICATION NO. : 13/835325  
DATED : March 7, 2017  
INVENTOR(S) : McNulty et al.

Page 1 of 1

It is certified that error appears in the above-identified patent and that said Letters Patent is hereby corrected as shown below:

In the Claims

Claim 5

Column 12, Line 45, change " $\int \int_t^{t+h} f(t) \approx hf(t+h);$ " to -- $\int_t^{t+h} f(t) \approx hf(t+h);$ --

Signed and Sealed this  
Twenty-fifth Day of April, 2017

Michelle K. Lee  
*Director of the United States Patent and Trademark Office*